United States Patent
Tsai et al.

(10) Patent No.: US 9,279,831 B2
(45) Date of Patent: Mar. 8, 2016

(54) PROBE CARD AND FABRICATING METHOD THEREOF

(75) Inventors: Chun-Yen Tsai, Hsinchu County (TW); Nien-Tsung Hsueh, Hsinchu County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 870 days.

(21) Appl. No.: 13/587,895

(22) Filed: Aug. 16, 2012

(65) Prior Publication Data

US 2013/0162281 A1 Jun. 27, 2013

Related U.S. Application Data

(60) Provisional application No. 61/580,309, filed on Dec. 27, 2011.

(30) Foreign Application Priority Data

May 28, 2012 (TW) .............................. 101118939 A

(51) Int. Cl.
| | | |
|---|---|---|
| *G01R 31/00* | (2006.01) | |
| *G01R 1/073* | (2006.01) | |
| *G01R 31/28* | (2006.01) | |
| *G01R 3/00* | (2006.01) | |

(52) U.S. Cl.
CPC ........ *G01R 1/07378* (2013.01); *G01R 31/2889* (2013.01); *G01R 3/00* (2013.01)

(58) Field of Classification Search
CPC ........... G01R 1/07342; G01R 31/2893; G01R 31/3025
USPC ............... 324/754.1, 754.07, 754.24, 755.01, 324/754.03, 756.03, 724, 437, 445, 446, 324/500; 438/14–18; 361/767–771, 803; 257/48

See application file for complete search history.

(56) References Cited

U.S. PATENT DOCUMENTS

| | | | | |
|---|---|---|---|---|
| 5,825,192 A | * | 10/1998 | Hagihara | ................. 324/756.03 |
| 7,301,326 B1 | | 11/2007 | Green | |
| 2010/0019787 A1 | * | 1/2010 | Huebner et al. | .............. 324/754 |

FOREIGN PATENT DOCUMENTS

| | | | |
|---|---|---|---|
| CN | 201382962 Y | | 1/2010 |
| CN | 101930016 A | | 12/2010 |
| JP | S63151041 A | | 6/1988 |
| JP | H04365344 A | | 12/1992 |
| JP | H0798330 A | | 4/1995 |
| JP | H1090305 A | | 4/1998 |
| JP | H1090306 A | | 4/1998 |
| JP | H1183901 A | | 3/1999 |
| JP | 2007292469 A | | 11/2007 |

(Continued)

*Primary Examiner* — Melissa Koval
*Assistant Examiner* — Trung Nguyen
(74) *Attorney, Agent, or Firm* — Winston Hsu; Scott Margo

(57) ABSTRACT

A probe card includes a circuit board and an integrated circuit (IC) test interface. The IC test interface includes a first probe assembly, disposed on a terminal of the circuit board, and a second probe assembly, disposed on another terminal of the circuit board, wherein the first probe assembly and the second probe assembly are separated to allow being independently assembled to, or disassembled from, the circuit board. Each of the first probe assembly and the second probe assembly includes a probe base, disposed on the circuit board; a plurality of needles, which are cantilever needles; and a covering layer, for covering the plurality of needles, and fixed on a surface of the probe base.

24 Claims, 7 Drawing Sheets

(56) References Cited

FOREIGN PATENT DOCUMENTS

| | | | |
|---|---|---|---|
| JP | 20083023 | A | 1/2008 |
| JP | 2008175656 | A | 7/2008 |
| JP | 2009139169 | A | 6/2009 |
| KR | 1020060078907 | A | 7/2006 |
| TW | 200937028 | | 9/2009 |
| TW | 201100811 | | 1/2011 |

* cited by examiner

PROBE CARD AND FABRICATING METHOD THEREOF

CROSS REFERENCE TO RELATED APPLICATIONS

This application claims the benefit of U.S. Provisional Application No. 61/580,309, filed on Dec. 27, 2011 and entitled "Probe Card and Fabricating Method Thereof", the contents of which are incorporated herein in their entirety.

BACKGROUND OF THE INVENTION

1. Field of the Invention

The present invention relates to a probe card and fabricating method thereof, and more particularly, to a probe card and fabricating method thereof utilized for testing chips or probe assemblies of an integrated circuit product, which has advantages of reusability, rapid substitution and expansion.

2. Description of the Prior Art

In general, an integrated circuit (IC) product is obtained by sequentially ongoing IC design, semiconductor processing, and fabrication of the IC, etc. After completion of these procedures, a probe card is used to perform multi-probe processes by contacting bonding pads. Only the chips qualified in the test or repaired chips are entered into subsequent bonding and packaging processes, and the packaged chips must still undergo a final test for quality check by using the probe card, i.e., in the fabrication process of the IC product, needles of the probe card are used to transmit testing signals which are used for testing a device under test (DUT) (e.g. the chip or the IC product), to determine whether the DUT is damaged.

In the prior art, a fabricating method of the probe card is to simultaneously dispose required needles from low to high on a probe assembly used for fixing the needles according to a needle layer, to ensure maintaining a level for each needle. For example, please refer to FIG. 1, which is a schematic diagram of a conventional probe card 10. The probe card 10 includes a circuit board 100 and an IC test interface 102. In detail, a slot is on a center of the circuit board 100, and a plurality of first holes 100a neighboring the slot are used for fixing internal components of the IC test interface 102 via a plurality of screws 104. The IC test interface 102 is used for testing the chips and the IC product, and composed of a reinforcement plate 106 and a probe assembly 108. Upper and lower sides of the reinforcement plate 106 include a plurality of second holes 106a, 106b, respectively. The reinforcement plate 106 is disposed on the slot of the center of the circuit board 100, for enhancing the fixation of the probe assembly 108. The probe assembly 108 is composed of a probe base 110, a covering layer 112 and a plurality of needles 114. The plurality of needles 114 are disposed from low to high on the covering layer 112 (e.g. an epoxy resin) according to the needle layer, for transmitting the testing signals of testing the chips and the IC product and returning test results. The covering layer 112 is connected to the probe base 110 (e.g. a ceramic strengthening ring), and fixed on the bottom of the reinforcement plate 106 by a plurality of screws 116 and a plurality of nuts 118.

When performing the multi-probe processes, the probe card 10 can be used for testing the DUT to determine whether the DUT is damaged. However, since a majority of needles of the probe card 10 are disposed on the probe assembly 108 which is used for fixing the needles, when the majority of needles need to be scrapped after use, a user cannot change only the damaged needles to reuse the probe card 10 but needs to purchase a new probe card. In such a condition, the utilization cost increases, and does not facilitate efficient use of resources.

Therefore, how to improve the drawback of inefficient use of the conventional probe card has become a main goal in the industry.

SUMMARY OF THE INVENTION

The disclosure provides a probe card and a fabricating method thereof utilized for testing chips or probe assemblies of an integrated circuit product, which have advantages of reusability, rapid substitution and expansion.

In an aspect, a probe card is provided, including a circuit board and an integrated circuit test interface. The integrated circuit test interface includes a first probe assembly, disposed on a terminal of the circuit board, and a second probe assembly, disposed on another terminal of the circuit board, wherein the first probe assembly and the second probe assembly are separated to allow being independently assembled to, or disassembled from, the circuit board. Each of the first probe assembly and the second probe assembly includes a probe base, disposed on the circuit board; a plurality of needles, which are cantilever needles; and a covering layer, for covering the plurality of needles, and fixed on a surface of the probe base.

In another aspect, a probe card is disclosed, including a circuit board and an integrated circuit test interface. The integrated circuit test interface includes a first probe assembly, disposed on a first terminal of the circuit board, and a second probe assembly, disposed on a second terminal of the circuit board.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
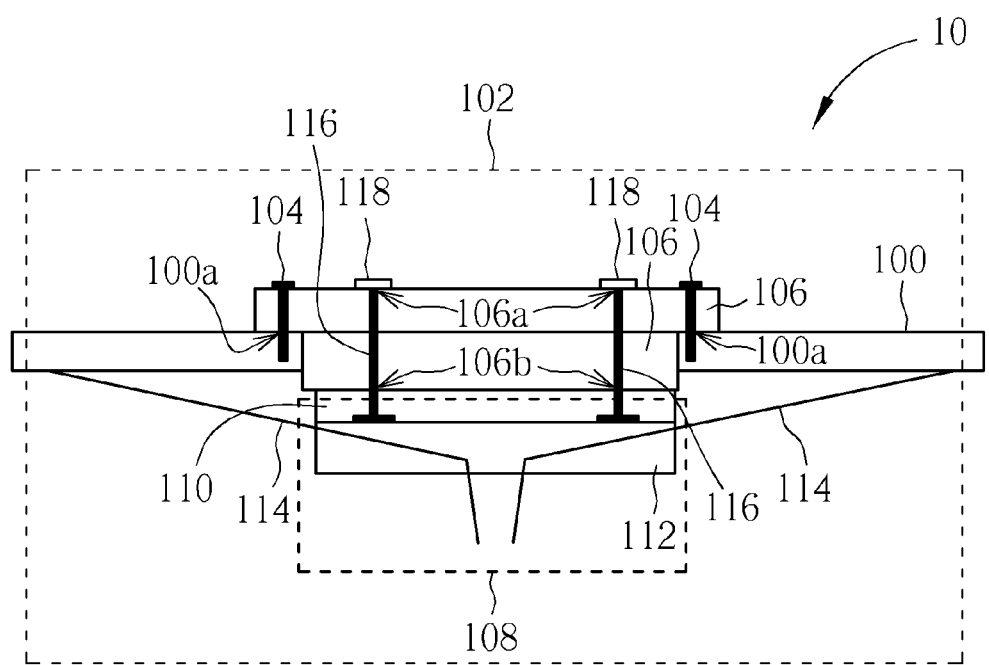
FIG. 1 is a schematic diagram of a conventional probe card.
Figure 2A:
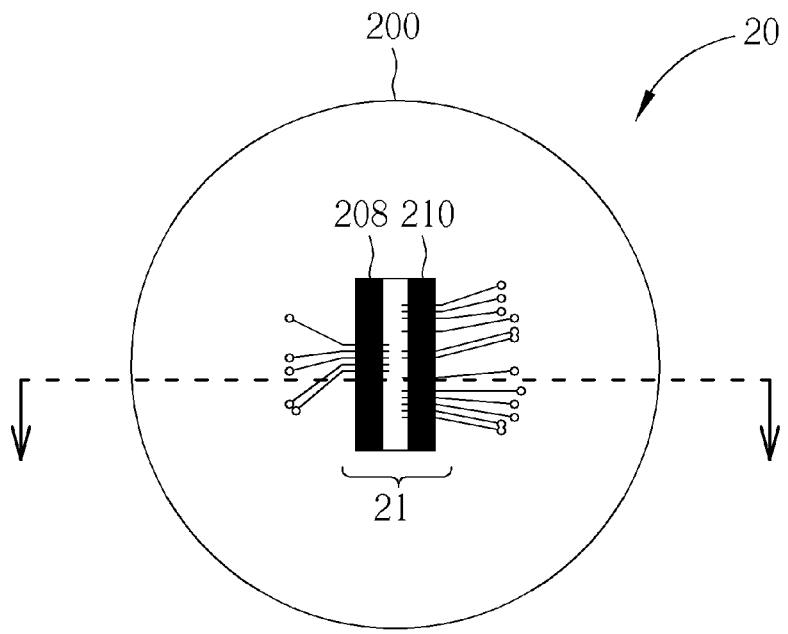
FIG. 2A is a bottom-view diagram of a probe card according to an embodiment of the present invention.
Figure 2B:
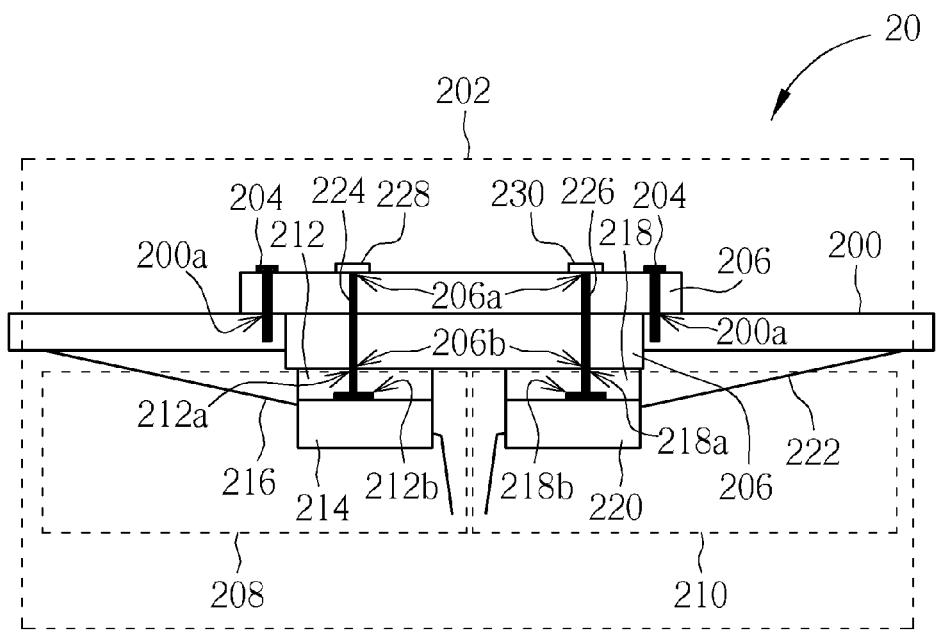
FIG. 2B is a sectional-view diagram of the probe card shown in FIG. 2A.

Please refer to FIG. 2A and FIG. 2B. FIG. 2A is a bottom-view diagram of a probe card 20 according to an embodiment of the present invention. FIG. 2B is a sectional-view diagram of the probe card 20 along a dotted line shown in FIG. 2A. The probe card 20 can be used for testing a fabricated wafer and an integrated circuit (IC) product, and a testing operator can output testing signals or receive test results via a single site 21, to determine whether chips or elements are damaged. As shown in FIG. 2B, the probe card 20 includes a circuit board 200 and an IC test interface 202. The IC test interface 202 mainly includes probe assemblies 208, 210, which are separated. The probe assembly 208 is disposed on a terminal of the circuit board 200 and the probe assembly 210 is disposed on another terminal of the circuit board 200.

Specifically, a slot can be formed, for example, on a center of the circuit board 200, and a plurality of first holes 200a can be formed, for example, in a neighbor area of the slot for fixing internal components of the IC test interface 202 via a plurality of screws 204. The IC test interface 202 can used for testing the chips and the IC product and can include a reinforcement plate 206 and probe assemblies 208, 210. Upper and lower sides of the reinforcement plate 206 can include a plurality of second holes 206a, 206b. The reinforcement plate 206 can be disposed on the slot of the center of the circuit board 200, for fixing the probe assemblies 208, 210. The probe assemblies 208, 210 can be respectively disposed on two relative terminals under the reinforcement plate 206 for transmitting the testing signals and returning the test results.

In other words, the probe assemblies 208, 210 are separated to allow being independently assembled to, or disassembled from, the reinforcement plate 206. Therefore, when the probe assembly 208 and/or the probe assembly 210 are consumed to be scrapped, the probe card 20 can be reused to perform testing by changing damaged probe assemblies (e.g. the probe assembly 208 and/or the probe assembly 210).

FIG. 2B is an embodiment which also displays detailed structures of the probe assemblies 208, 210. In the embodiment, the probe assemblies 208, 210 can be cantilever probe assemblies. The probe assembly 208 is composed of a probe base 212, a covering layer 214 and a plurality of needles 216, and similarly, the probe assembly 210 comprises a probe base 218, a covering layer 220 and a plurality of needles 222. The plurality of needles 216, 222 are used for transmitting the testing signals and returning the test results, and are respectively disposed from low to high on the covering layers 214, 220 according to a needle layer, which the covering layers 214, 220 can enhance the fixation of the plurality of needles 216, 222. The probe bases 212, 218 are respectively connected to the covering layers 214, 220, for enhancing the fixation of the covering layers 214, 220. Besides, a plurality of third holes 212a, 212b, 218a, 218b corresponding to a plurality of second holes 206b of the reinforcement plate 206 are formed on upper and lower sides of the probe bases 212, 218, respectively, to lock the probe bases 212, 218 to the two relative terminals of the reinforcement plate 206 via one or more screws 224, 226 and one or more nuts 228, 230. In short, the probe base 212 and the probe base 218 are separated and not permanently connected to each other, and the covering layers 214, 220 can be respectively connected to the probe base 212 or the probe base 218, and thus the probe assemblies 208, 210 can be independently assembled, disassembled and fabricated (details are described in following).

Note that, FIG. 2A and FIG. 2B are utilized as an example for illustrating the concept of the present invention, and those skilled in the art may make alterations or modifications according to the concept of the present invention, and is not limited to this. For example, in FIG. 2B, the circuit board 200 can be a printed circuit board of any type such as, inter alia, a rectangle, a circle or a square, depending on the user requirements. The reinforcement plate 206 can be made from metallic materials, such as, inter alia, aluminum, stainless steel, and can also be a composition including the multiple probe assemblies 208, 210. In addition, in this embodiment, the probe assemblies 208, 210 are disposed on two sides of the underside of the reinforcement plate 206, but the invention is not limited to this. In other embodiments, in addition to the probe assemblies 208, 210 disposed on the two relative sides (e.g. right and left sides) under the reinforcement plate 206, multiple probe assemblies can also be disposed other two relative sides (e.g. front and rear sides) under the reinforcement plate 206 in a similar way. For example, if a quadrate chip with test pads on the four sides such as system on chip (SOC) needs to be tested, four probe assemblies, which can be independently assembled, disassembled and fabricated, can be disposed under the reinforcement plate 206, to perform testing. In addition, there can be one or more slots which can be formed on the circuit board in a geometric pattern. The geometric pattern can be quadrilateral, or any other shape as designed. The location(s) of the one ore more slots is exemplarily shown on the center of the circuit board, but can be in other places as required.

In addition, it is noted that although the embodiment is shown with the probe assembly 208 and the probe assembly 210 separated from each other by a distance in space, the term "separated" in the disclosure does not necessarily mean "separated by a distance on the probe card". For example, in some alternative embodiments, the probe assemblies can be touched, connected, or coupled whey they are fixed on the probe card, while they can be independently assembled to or/and disassembled from the probe card. In other words, "the probe assemblies are separated" in the disclosure can mean that the probe assemblies can be independently moved, or they can actually be separated, or they can be viewed as at least two parts, at least during the assembling and/or disassembling process. Therefore, any variation of the embodiments allowing at least one of the advantages is in the scope of the invention.

Furthermore, the probe bases 212, 218 can be made from materials with anti-electric leakage characteristics, such as a ceramic strengthening ring. The probe bases 212, 218 can not only be locked to the reinforcement plate 206 by the plurality of screws 224, 226 but also can be connected to the reinforcement plate 206 according to different processes. The covering layers 214, 220 can be made from thermosetting materials, such as epoxy resin. In addition, in the embodiment of the present invention, the plurality of needles 216 may be used as input pins, for inputting the testing signals, and the plurality of needles 222 may be used as output pins, for outputting the test results. In other embodiments, the plurality of needles 216, 222 can act as the input pins, the output pins or a combination of the input pins and the output pins, and horizontal differences of adjusting the plurality of needles 216, 222 can be adjusted by fixing the horizontal positions of the plurality of needles 222, so as to horizontally adjust the plurality of needles 216. The reason is that the number of needles (the plurality of needles 222) of an output terminal is larger than the number of needles (the plurality of needles 216) of an input terminal, and thus it is more likely to fix the horizontal positions of the needles of the output terminal to horizontally adjust the needles of the input terminal. However, the user can also fix the horizontal positions of the plurality of needles 216, so as to horizontally adjust the plurality of needles 222. These or other derivative applications are known to those skilled in the art.

Figure 3A:
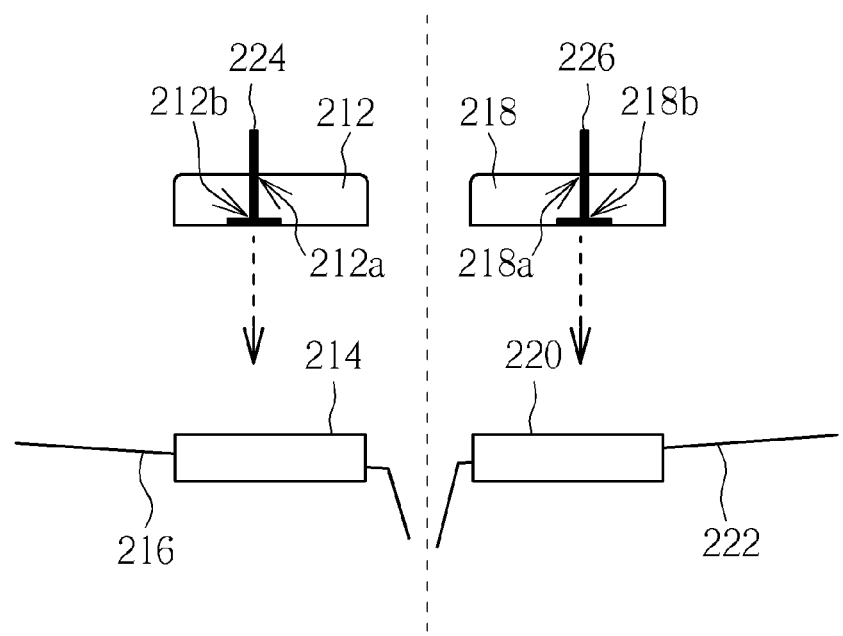
FIG. 3A to FIG. 3D are an embodiment of operating processes of fabricating and assembling of the probe card shown in FIG. 2B.
Figure 3B:
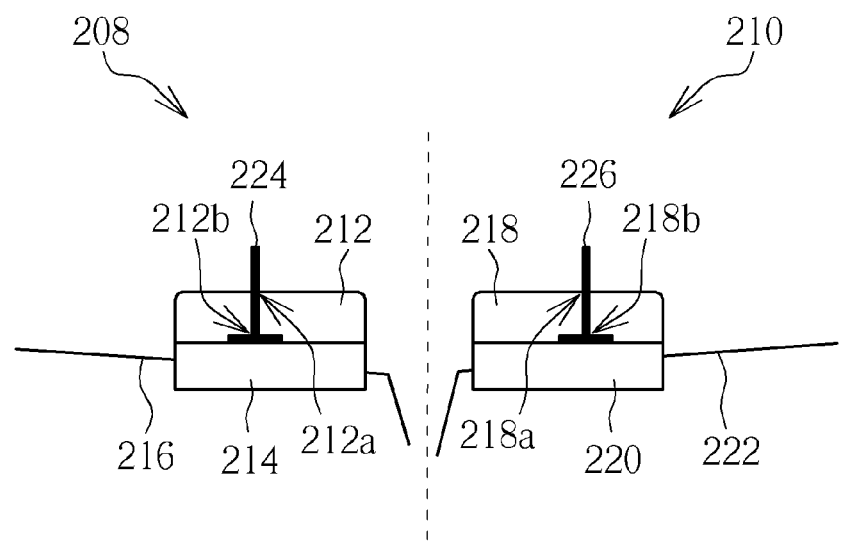
Figure 3C:
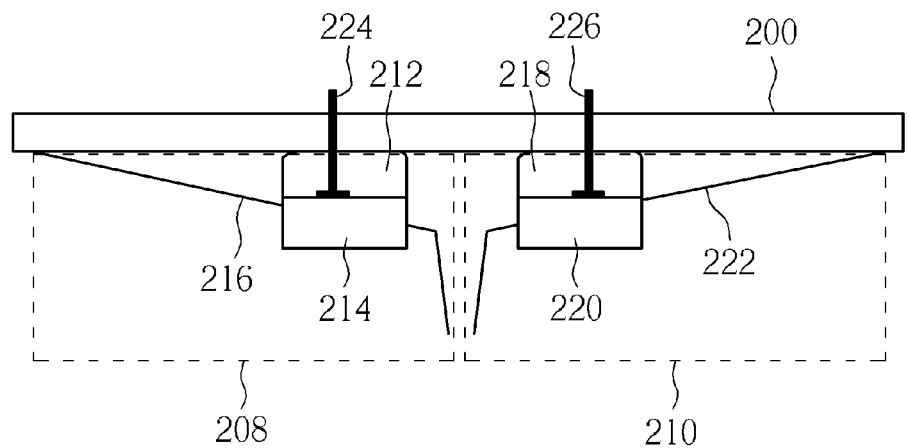
Figure 3D:
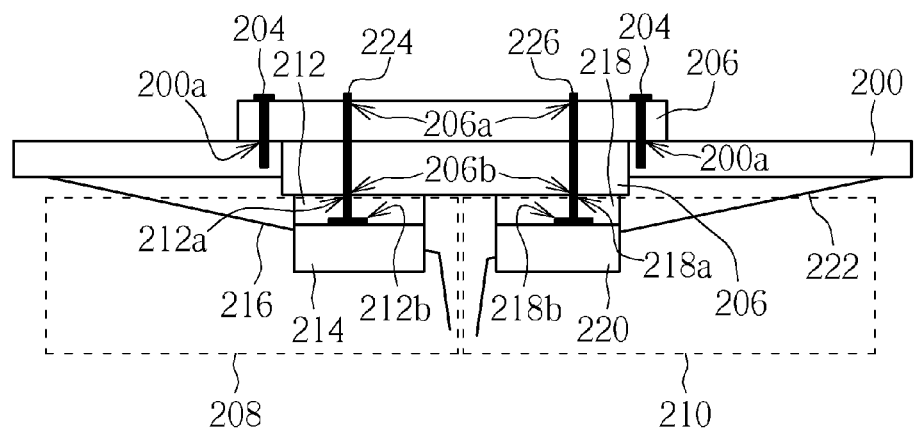
Figure 4:
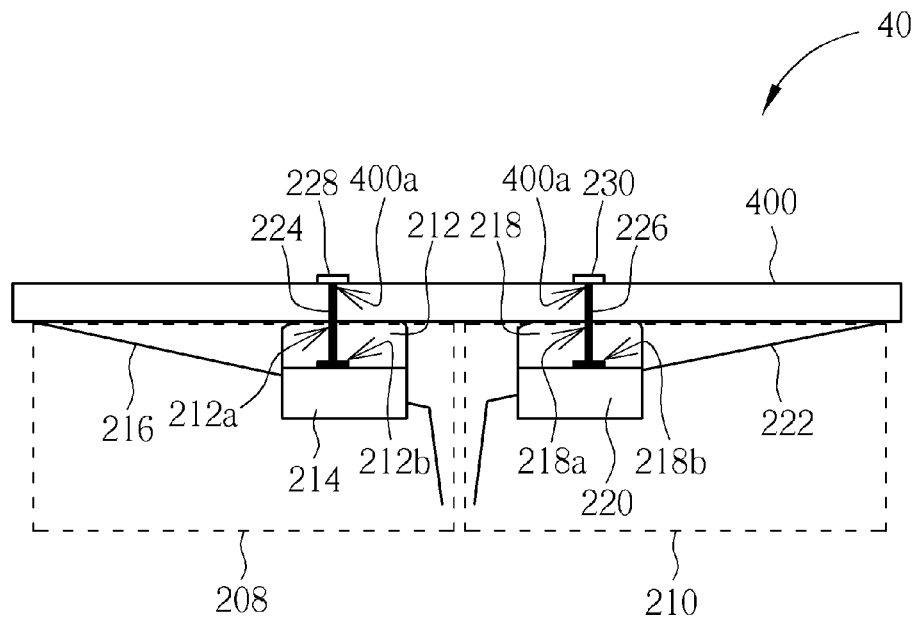
FIG. 4 to FIG. 7 are structural diagrams of probe cards according to different embodiments of the present invention.
Figure 5:
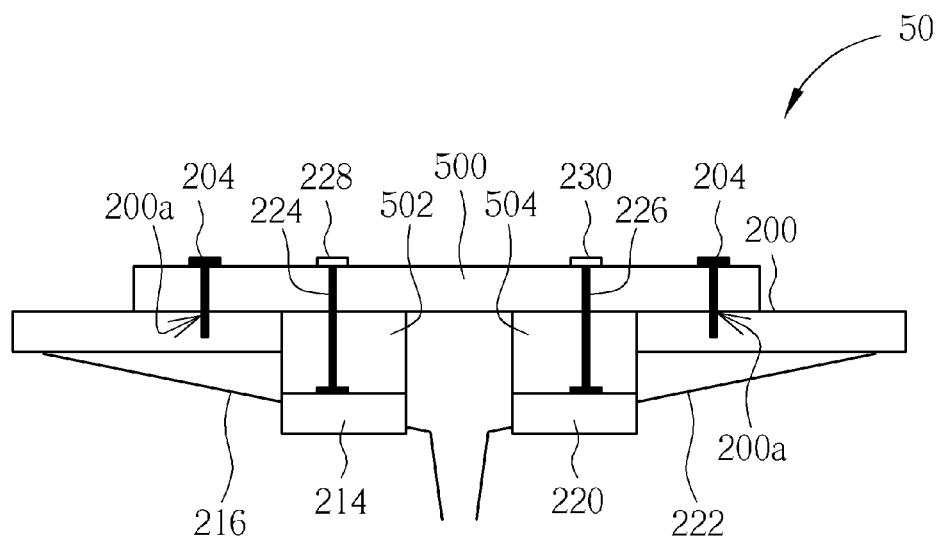
Figure 6:
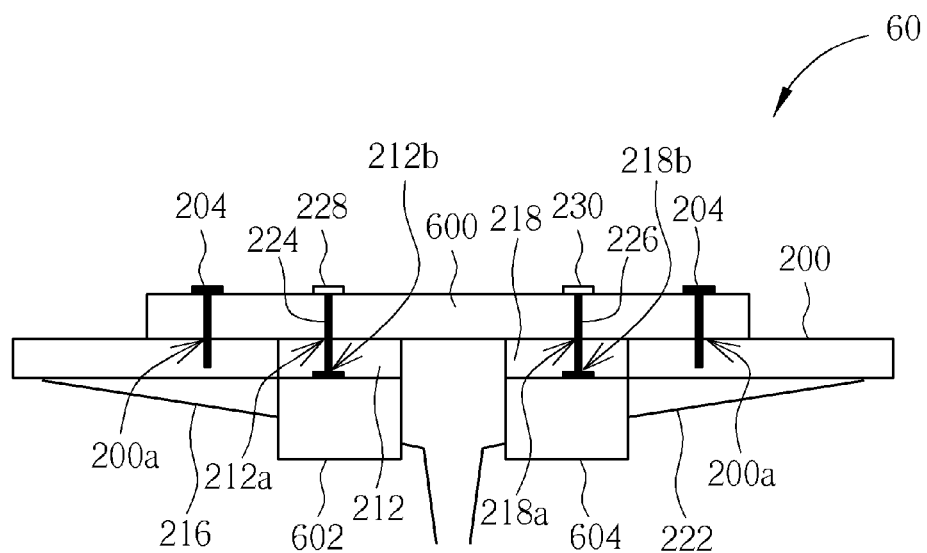
Figure 7:
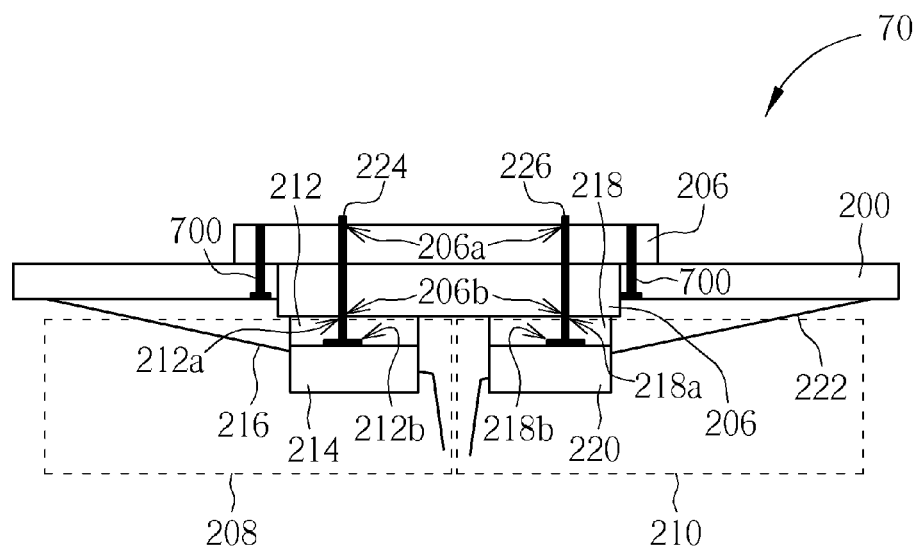

Fabricating and assembling methods of the embodiment of the probe card 20 shown in FIG. 2B can be referred to in FIG. 3A to FIG. 3D, which are an embodiment of operating processes of fabricating and assembling of the probe card 20. Note that, FIG. 3A and FIG. 3D are utilized for illustrating the concept of fabricating and assembling of the probe card 20 of the present invention, and those skilled in the art may make alterations or modifications according to the concept of the present invention, and is not limited to this.

First, as shown in FIG. 3A, the plurality of screws 224, 226 are passed through the plurality of third holes 212b, 218b under the probe bases 212, 218, respectively, and the plurality of needles 216, 222 are respectively disposed from low to high on the covering layers 214, 220 according to the needle layer. Then, the probe bases 212, 218 are moved along a dotted line directions shown in FIG. 3A, to be bonded on the covering layers 214, 220, so as to form the probe assemblies 208, 210 shown in FIG. 3B. In such a condition, the probe assemblies 208, 210 can be independently designed or fabricated, and the probe assembly 208 is not permanently connected to and simultaneously fabricated with the probe assembly 210. In other words, if the subsequent probe assembly 210 (the output pins) have the same permutation, the user can perform testing by directly disassembling the probe assembly 208 (the input pins) and assembling the probe assembly of a new product so as to reuse the probe assembly 210. Similarly, the probe assembly 210 can also be independently disassembled, to allow reusability of the probe assembly 208.

Then, as shown in FIG. 3C, the plurality of needles 216, 222 of the probe assemblies 208, 210 are soldered under the circuit board 200. Afterwards, as shown in FIG. 3D, the bottom of the reinforcement plate 206 is disposed on the slot of the center of the circuit board 200 while the plurality of screws 224, 226 of the probe assemblies 208, 210 are passed through the plurality of second holes 206b under the reinforcement plate 206, and tails of the plurality of screws 224, 226 are passed through the plurality of second holes 206a on the reinforcement plate 206. Then, the plurality of screws 204 are locked to the reinforcement plate 206 and the plurality of first holes 200a of the circuit board 200, to fix the reinforcement plate 206. Finally, the plurality of nuts 228, 230 are locked to the tails of the plurality of screws 224, 226, respectively, to fix the reinforcement plate 206 and the probe assemblies 208, 210, so as to finish the fabrication of the probe card 20. In such a condition, the probe assemblies 208, 210 can be not only independently designed and fabricated but also independently assembled to the circuit board 200. Besides, when performing disassembly, the user can disassemble the probe assembly 208 and/or 210 via loosening the plurality of nuts 228 and/or 230 and desoldering the needles 216 and/or 222 which are soldered to the circuit board 200. Therefore, when the probe assembly 208 and/or the probe assembly 210 are ready to be scrapped, the user can only change the damaged probe assemblies to reuse the probe card 20 to perform testing.

Note that, FIG. 2B is utilized for illustrating a structural diagram of the probe card 20 of one embodiment of the present invention, and those skilled in the art may make alterations or modifications according to the concept of the present invention, and is not limited to this. For example, please refer to FIG. 4 to FIG. 7, which are structural diagrams of probe cards 40, 50, 60, 70 according to other different embodiments of the present invention. The structures of the probe cards 40, 50, 60, 70 are similar to that of the probe card 20, respectively, and the same components are denoted by the same symbols. Differences between the probe card 40 and the probe card 20 are that the probe card 40 not only does not include the reinforcement plate 206 of the probe card 20 but also does not include the slot on the center of a circuit board 400. Therefore, the plurality of screws 224, 226 of the probe assemblies 208, 210 can be passed directly through the plurality of first holes 400a of the circuit board 400, and the plurality of nuts 228, 230 can be locked to the tails of the plurality of screws 224, 226, so as to finish the fabrication of the probe card 40 without using the reinforcement plate.

Differences between the probe card 50 and the probe card 20 are that the thickness of a reinforcement plate 500 of the probe card 50 is thinner than that of the reinforcement plate 206 of the probe card 20, and the heights of probe bases 502, 504 are higher than that of the probe bases 212, 218. Differences between the probe card 60 and the probe card 20 are that the thickness of a reinforcement plate 600 of the probe card 60 is thinner than that of the reinforcement plate 206 of the probe card 20, and the heights of covering layers 602, 604 are higher than that of the covering layers 214, 220. A difference between the probe card 70 and the probe card 20 is that the probe card 70 includes a plurality of screws 700 locked from the bottom of the circuit board 200 to the circuit board 200 and the reinforcement plate 206. These variations, which can also allow reusing the probe card by changing the damaged probe assemblies when the consumed probe assemblies are to be scrapped, are still in the scope of the present invention.

To sum up, in the above different embodiments, the probe assemblies 208, 210 both can be independently fabricated and respectively disposed on the relative two terminals under the circuit board 200. Besides, one or two of the probe assemblies 208 and 210 can be disassembled by loosening the plurality of nuts 228 or/and 230 and desoldering the plurality of needles 216 or/and 222 which are soldered to the circuit board 200. Therefore, when the consumed probe assemblies are to be scrapped, the probe card can be reused to perform testing by changing the damaged probe assemblies without changing all of the probe assemblies On the other hand, in FIG. 2A, the probe card 20 only includes the single site 21. However, in practice, in other embodiments, the probe card 20 can also include multiple sites. For example, please refer to FIG. 8, which is a structural diagram of a probe card 80 according to an embodiment of the present invention. A difference between the probe card 80 and the probe card 20 is that the probe card 80 is a dual site probe card. The probe card 80 includes a circuit board 800, probe assemblies 802, 804 and sites 806, 808. The circuit board 800 has two slots, for being combined with the probe assemblies 802, 804, respectively. The structure of the probe assembly 802 is substantially similar to that of the conventional probe assembly (i.e. the probe assembly which does not have reusability) and the structure of the probe assembly 804 is substantially similar to that of the probe assembly 210 of the probe card 20, and are not narrated hereinafter. Besides, since the sites 806, 808 both can be used for transmitting the testing signals and returning the test results, the probe card 80 is a dual site probe card. The probe card 80 is the derivative alteration of the probe card 20, and thus the detailed fabrications and alterations can be derived by referring to the above description. Similarly, the probe assemblies 802, 804 can also be assembled and disassembled, respectively, or independently designed and fabricated. Therefore, when the consumed probe assembly 802 and/or the probe assembly 804 are to be scrapped, the probe card 80 can be reused to perform testing by changing the probe assemblies (e.g. the probe assemblies 802 and/or 804). Similarly, in a multi-site probe card which has more than two sites, different sites and different arrangements thereof can be separately fabricated and combined to the circuit board with similar combination concept.

Figure 8:
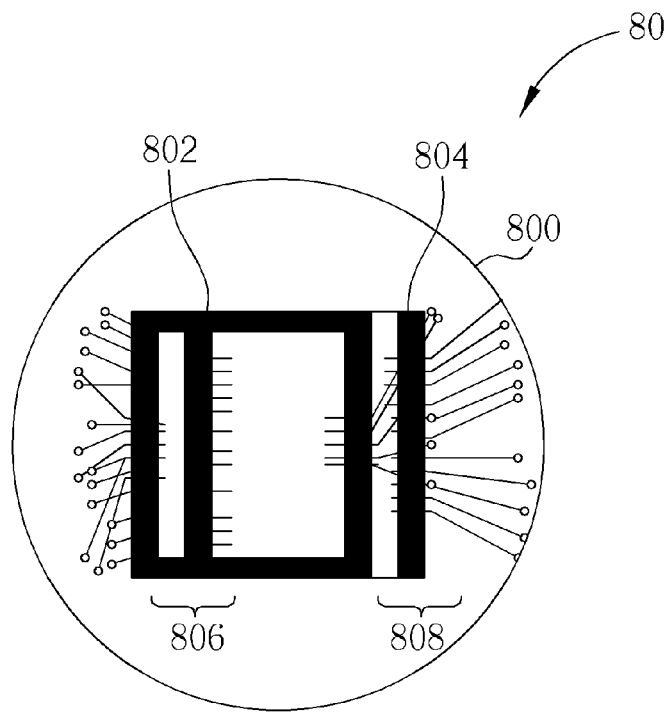
FIG. 8 is a structural diagram of a probe card according to an embodiment of the present invention.
Figure 9:
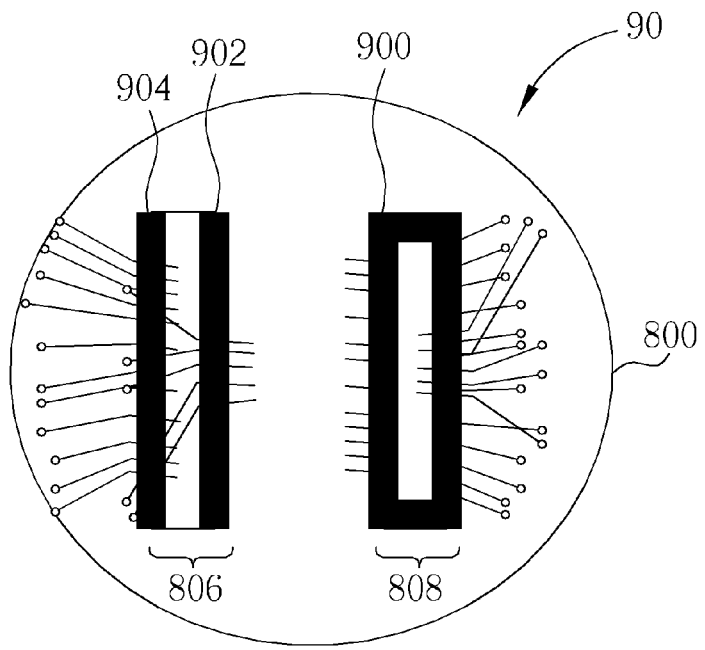
FIG. 9 is a structural diagram of another embodiment of the probe card shown in FIG. 8.

Note that, FIG. 8 is utilized for illustrating the dual site probe card of the embodiment of the present invention, and those skilled in the art may make alterations or modifications according to the concept of the present invention, and is not limited to this. For example, please refer to FIG. 9, which is a structural diagram of a probe card 90 according to an embodiment of the present invention. The structure of the probe card 90 is similar to that of the probe card 80, and the same components are denoted by the same symbols. A difference between the probe card 90 and the probe card 80 is that the probe card 90 includes probe assemblies 900, 902 and 904. The structure of the probe assembly 900 is substantially similar to that of the conventional probe assembly, and each of the structures of the probe assemblies 902, 904 is substantially similar to that of the probe assembly 804 of the probe card 80, and such variations, which can also allow reusing the probe card by only changing the damaged probe assemblies when the consumed probe assemblies are to be scrapped, are still in the scope of the present invention. In addition, note that although in the embodiments of FIG. 8 and FIG. 9, one side of the dual site probe card has the conventional probe assembly and the other side has one or two probe assemblies which have the similar structure to that of the probe assembly 804, in other embodiments, two sides of the dual site probe card can both be disposed with two probe assemblies each of which has a similar structure to that of the probe assembly 804. In other words, this dual site probe card can have four probe assemblies. Besides, structures and modifications of the above dual site probe card can further be applied to the multi-site probe card, and are not narrated hereinafter for simplicity.

In the prior art, the fabricating method of the probe card is to simultaneously dispose all of the needles from low to high on a single probe assembly used for fixing the needles according to the needle layer. Thus, in the process of performing wafer and production testing for the conventional probe card, when the consumed needles are to be scrapped, the user needs to change the entire set of the probe card to perform testing. In comparison, the embodiments disclose a probe card with multiple probe assemblies that can be independently assembled, disassembled and even independently designed and fabricated. Therefore, when the consumed needles are to be scrapped, the user only needs to change the damaged probe assemblies to perform testing again without changing the entire set of the probe card, so as to reduce the utilization cost.

To sum up, the probe assemblies of the embodiments are separated, and can be independently assembled or disassembled. Therefore, when the majority of needles of the probe assemblies are consumed, the user only needs to change the damaged probe assemblies to perform testing without changing the entire set of the probe card, so as to reduce the utilization cost and allow the probe card to have reusability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A probe card, comprising:
   a circuit board, wherein a slot is formed on the circuit board; and
   an integrated circuit (IC) test interface, comprising:
      a reinforcement plate, disposed on the slot of the circuit board;
      a first probe assembly, disposed on a terminal of the circuit board and a terminal of the reinforcement plate, and
      a second probe assembly, disposed on another terminal of the circuit board and another terminal of the reinforcement plate, wherein
      the first probe assembly and the second probe assembly are separated to allow being independently assembled to or disassembled from the circuit board, and each of the first probe assembly and the second probe assembly, comprising:
         a probe base, disposed on the circuit board;
         a plurality of needles, which are cantilever needles; and
         a covering layer, for covering the plurality of needles, and fixed on a surface of the probe base.

2. The probe card of claim 1, wherein the circuit board comprises a plurality of first holes, corresponding to a plurality of fixed positions of the first probe assembly and the second probe assembly.

3. The probe card of claim 2, wherein the probe base of each of the first probe assembly and the second probe assembly comprises at least one second hole, corresponding to at least one first hole of the plurality of first holes of the circuit board.

4. The probe card of claim 3, wherein the each of the first probe assembly and the second probe assembly further comprises at least one screw, a terminal of each screw passes through a second hole of the probe base and a first hole of the circuit board, and another terminal hooked in the second hole of the probe base.

5. The probe card of claim 4, wherein the IC test interface further comprises at least one nut, for locking the at least one screw when the at least one screw passes through the at least one second hole of the probe base and the at least one first hole of the circuit board.

6. The probe card of claim 1, wherein
   at least one another slot is further formed on the circuit board,
   the probe card further comprises at least one another IC test interface, disposed on the at least one slot of the circuit board, respectively; and
   each of the at least one another IC test interface further comprises a reinforcement plate disposed on one of the at least one another slot of the circuit board, respectively, wherein
      the first probe assembly is disposed on a terminal of the reinforcement plate, and
      the second probe assembly is disposed on another terminal of the reinforcement plate.

7. The probe card of claim 6, wherein the slot and the at least one another slot are formed on the circuit board in a geometric pattern.

8. A probe card, comprising:
   a circuit board, wherein a slot is formed on the circuit board; and
   an IC test interface, comprising:
      a reinforcement plate, disposed on the slot of the circuit board;
      a first probe assembly is disposed on a first terminal of the circuit board and a terminal of the reinforcement plate, and
      a second probe assembly is disposed on a second terminal of the circuit board and another terminal of the reinforcement plate.

9. The probe card of claim 8, wherein the first probe assembly and the second probe assembly are separated to allow being independently assembled or disassembled.

10. The probe card of claim 8, wherein each of the first probe assembly and the second probe assembly comprises:
   a probe base, disposed on the circuit board;
   a plurality of needles; and
   a covering layer, for covering the plurality of needles, and fixed on a surface of the probe base.

11. The probe card of claim 10, wherein the circuit board comprises a plurality of first holes, corresponding to a plurality of fixed positions of the first probe assembly and the second probe assembly.

12. The probe card of claim 11, wherein
the probe base of each of the first probe assembly and the second probe assembly comprises at least one second hole, corresponding to at least one first hole of the plurality of first holes of the circuit board, and
the each of the first probe assembly and the second probe assembly further comprises at least one screw, a terminal of each screw passes through a second hole of the probe base and a first hole of the circuit board, and another terminal hooked in the second hole of the probe base.

13. The probe card of claim 12, wherein the IC test interface further comprises at least one nut, for locking the at least one screw when the at least one screw passes through the at least one second hole of the probe base and the at least one first hole of the circuit board.

14. The probe card of claim 10, wherein the plurality of needles are cantilevered.

15. The probe card of claim 10, wherein the probe base is made from ceramic strengthening ring.

16. The probe card of claim 10, wherein the covering layer is made from epoxy resin.

17. The probe card of claim 8, wherein the each of the first probe assembly and the second probe assembly comprises:
a probe base, disposed on the circuit board;
a plurality of needles; and
a covering layer, for covering the plurality of needles, and fixed on a surface of the probe base.

18. The probe card of claim 17, wherein the reinforcement plate comprises a plurality of first holes, corresponding to a plurality of fixed positions of the first probe assembly and the second probe assembly.

19. The probe card of claim 18, wherein
the probe base of each of the first probe assembly and the second probe assembly further comprises at least one second hole, corresponding to at least one first hole of the plurality of first holes of the reinforcement plate, and
the each of the first probe assembly and the second probe assembly further comprises at least one screw, a terminal of each screw passes through a second hole of the probe base and a first hole of the reinforcement plate, and another terminal hooked in the second hole of the probe base.

20. The probe card of claim 19, wherein the IC test interface further comprises at least one nut, for locking the at least one screw when the at least one screw passes through the at least one second hole of the probe base and the at least one first hole of the reinforcement plate.

21. The probe card of claim 8, wherein
at least one another slot is further formed on the circuit board,
the probe card further comprises at least one another IC test interface, disposed on the at least one slot of the circuit board, respectively; and
each of the at least one another IC test interface further comprises a reinforcement plate, disposed on one of the at least one another slot of the circuit board, respectively, wherein
the first probe assembly is disposed on a terminal of the reinforcement plate, and
the second probe assembly is disposed on another terminal of the reinforcement plate.

22. The probe card of claim 21, wherein the slot and the at least one another slot are formed on the circuit board in a geometric pattern.

23. The probe card of claim 22, wherein the geometric pattern is a quadrilateral.

24. The probe card of claim 8, wherein the IC test interface further comprises:
a third probe assembly is disposed on a third terminal of the circuit board, and
a fourth probe assembly is disposed on a fourth terminal of the circuit board.

\* \* \* \* \*